(12) United States Patent
Mease et al.

(10) Patent No.: US 7,342,794 B1
(45) Date of Patent: Mar. 11, 2008

(54) HEAT SINK WITH INTEGRAL CARD GUIDE

(75) Inventors: Keith D. Mease, Gibbstown, NJ (US); Sean M. McClain, Havertown, PA (US)

(73) Assignee: Unisys Corporation, Blue Bell, PA (US)

( * ) Notice: Subject to any disclaimer, the term of this patent is extended or adjusted under 35 U.S.C. 154(b) by 180 days.

(21) Appl. No.: 10/651,115

(22) Filed: Aug. 28, 2003

(51) Int. Cl.
*H05K 7/20* (2006.01)
*H05K 7/18* (2006.01)
*F28F 7/00* (2006.01)
*H01L 23/34* (2006.01)

(52) U.S. Cl. ............... 361/710; 361/690; 361/704; 361/707; 361/756; 361/802; 165/80.3; 257/707

(58) Field of Classification Search ............ 361/688, 361/690, 756, 802, 704, 707, 710, 719, 720, 361/741, 697, 715; 165/80.2, 80.3, 185; 257/706–707, 712–713, 718–719, 726–727
See application file for complete search history.

(56) References Cited

U.S. PATENT DOCUMENTS

| | | | | |
|---|---|---|---|---|
| 3,631,325 A | * | 12/1971 | Wenz ................... | 361/705 |
| 3,845,359 A | * | 10/1974 | Fedele ................. | 361/752 |
| 4,330,812 A | * | 5/1982 | Token .................. | 361/720 |
| 4,785,379 A | * | 11/1988 | Goodrich .............. | 361/711 |
| 5,019,939 A | * | 5/1991 | Reimer ................ | 361/721 |
| 5,815,371 A | * | 9/1998 | Jeffries et al. ........ | 361/704 |
| 5,883,784 A | * | 3/1999 | Hughes et al. ........ | 361/707 |
| 5,986,888 A | * | 11/1999 | Amaro et al. ......... | 361/704 |
| 6,226,185 B1 | * | 5/2001 | Lin ..................... | 361/704 |
| 6,278,609 B1 | * | 8/2001 | Suzuki et al. ......... | 361/704 |
| 6,307,748 B1 | * | 10/2001 | Lin et al. ............. | 361/704 |
| 6,362,963 B1 | * | 3/2002 | Lee et al. ............ | 361/704 |
| 6,377,463 B1 | * | 4/2002 | Shah ................... | 361/720 |
| 6,459,583 B1 | * | 10/2002 | Lo ...................... | 361/704 |
| 6,680,849 B2 | * | 1/2004 | Atkinson et al. ...... | 361/719 |

* cited by examiner

*Primary Examiner*—Boris Chervinsky
*Assistant Examiner*—Zachary M Pape
(74) *Attorney, Agent, or Firm*—Richard J. Gregson; Robert P. Marley; RatnerPrestia

(57) ABSTRACT

A heat sink is configured to support an edge of a circuit card. The heat sink comprises a thermally conductive base, a plurality of thermally conductive heat dissipating fins extending from the base, and one or more recesses at least partially defined by at least one of the fins or by the base. The recesses are configured to support the edge of the circuit card.

19 Claims, 4 Drawing Sheets

US 7,342,794 B1

HEAT SINK WITH INTEGRAL CARD GUIDE

FIELD OF THE INVENTION

The present invention generally relates to a heat sink for dissipating heat from electronic components and more particularly relates to a heat sink having one or more recesses for guiding circuit cards.

BACKGROUND OF THE INVENTION

Electronic systems demand increasingly higher performance in increasingly smaller space and at an increasingly smaller cost. The current trend in electronic systems is to reduce the overall size, cost and complexity of components to meet these requirements. Heat sinks are commonly used in such electronic systems to dissipate heat from a heat-generating component, such as an ASIC device. The heat transfer capability of heat sinks, however, depends upon their size, substantially limiting effective reduction of their size.

Card guides are commonly used to carry and support an edge of a circuit card to align it with a connector and/or to maintain spacing from other components of an electronic system, for example. Exemplary card guides have sufficient structural strength to gather, guide, and/or retain a circuit card. This structural requirement can substantially limit effective size reduction of the card guide.

SUMMARY OF THE INVENTION

The present invention, in one aspect, provides a heat sink configured to support an edge of a circuit card. The heat sink comprises a thermally conductive base, a plurality of thermally conductive heat dissipating fins extending from the base, and one or more recesses at least partially defined by at least one of the fins or by the base. The recesses are configured to support the edge of the circuit card.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features may be arbitrarily expanded or reduced for clarity. Included in the drawings are the following figures.

DETAILED DESCRIPTION OF THE INVENTION

Figure 1:
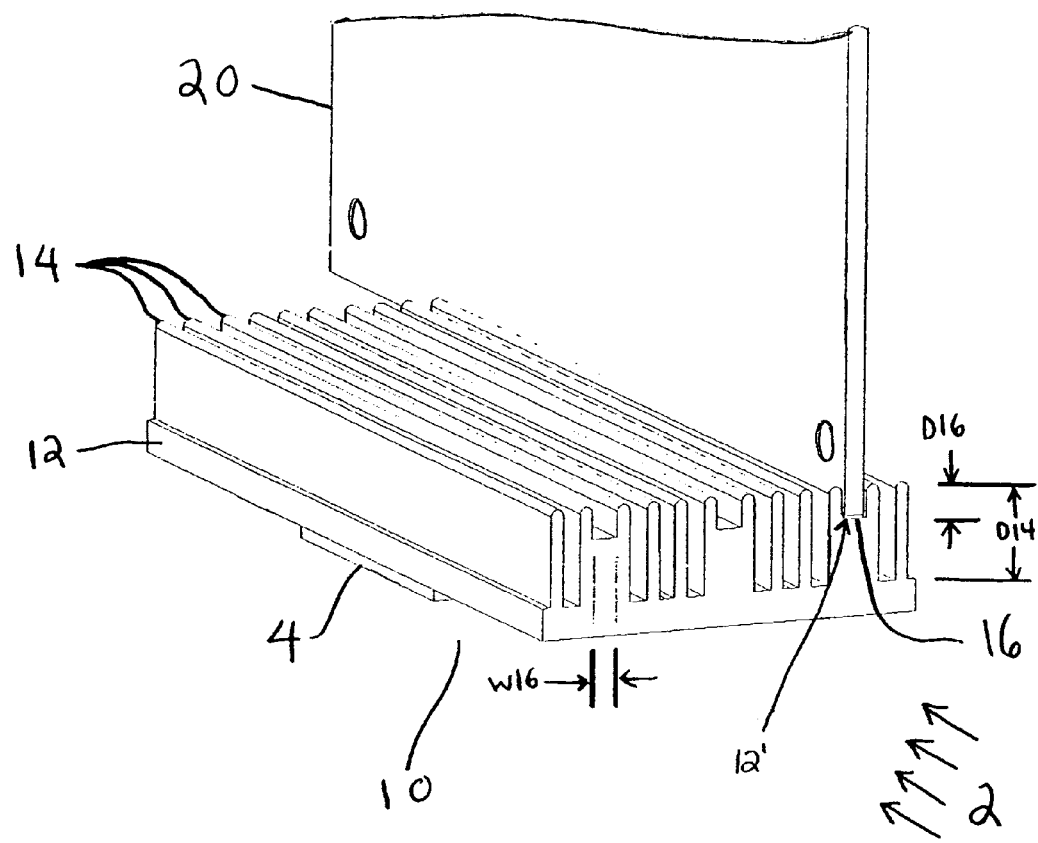
FIG. 1 is an isometric view of an exemplary heat sink with recesses for guiding a circuit card according to aspects of the present invention.

Referring to the drawings generally, the present invention, in one aspect, provides a heat sink 10 configured to support an edge of a circuit card 20. The heat sink 10 comprises a thermally conductive base 12, a plurality of thermally conductive heat dissipating fins 14 extending from the base 12, and one or more recesses 16 at least partially defined by at least one of the fins 14 or by the base 12. The recesses 16 are configured to support the edge of the circuit card 20.

Referring now to the drawings, in which like reference numbers refer to like elements throughout, FIG. 1 shows an exemplary heat sink 10 for dissipating heat from heat-generating component 4 (e.g., a semiconductor chip) and guiding a circuit card 20 according to aspects of the present invention. Heat sink 10 comprises a base 12, fins 14 extending from base 12, and one or more recesses 16 defined by the base 12 and/or one or more of the fins 14. Base 12 comprises a thermally conductive material, such as aluminum. As shown in FIG. 1, base 12 may have a face configured to abut a heat-generating component 4. Thus, heat sink 10 provides a thermal path from heat-generating component 4 to fins 14 by thermal conduction to dissipate heat generated by heat-generating component 4.

Fins 14 extend from base 12 to a height D14 appropriate for dissipating the heat generated by heat-generating component 4. Fins 14 are generally parallel and are spaced apart to form gaps between adjacent fins so that heat can dissipate into air surrounding fins 14 by convection. Airflow 2 may be provided parallel to fins 14 to facilitate heat dissipation. Fins 14 comprise a thermally conductive material, for example, aluminum. Further, as shown in FIG. 1, fins 14 and base 12 are optionally integrally formed with one another. In an exemplary embodiment of the present invention, heat sink 10 may be formed from a single extrusion.

One or more recesses 16 are formed in heat sink 10 to carry an edge of a circuit card 20. Recesses 16 may be defined by base 12, by one or more fins 14 or fin portions (as shown in FIG. 1), or by a combination of base 12 and one or more fins 14. In an exemplary embodiment, recess 16 are slots or grooves configured to carry the edge of circuit board 101. Each of the one or more recesses 16 has a width W16 sufficient to receive the edge of circuit card 20 and to provide support to hold circuit card 20 in alignment with a corresponding one of recesses 16. Each of the one or more recesses 16 has a depth D16, extending to a portion 12' of the base 12, sufficient to support circuit card 20 without interfering with components (not shown) mounted on circuit bard 20.

Figure 2:
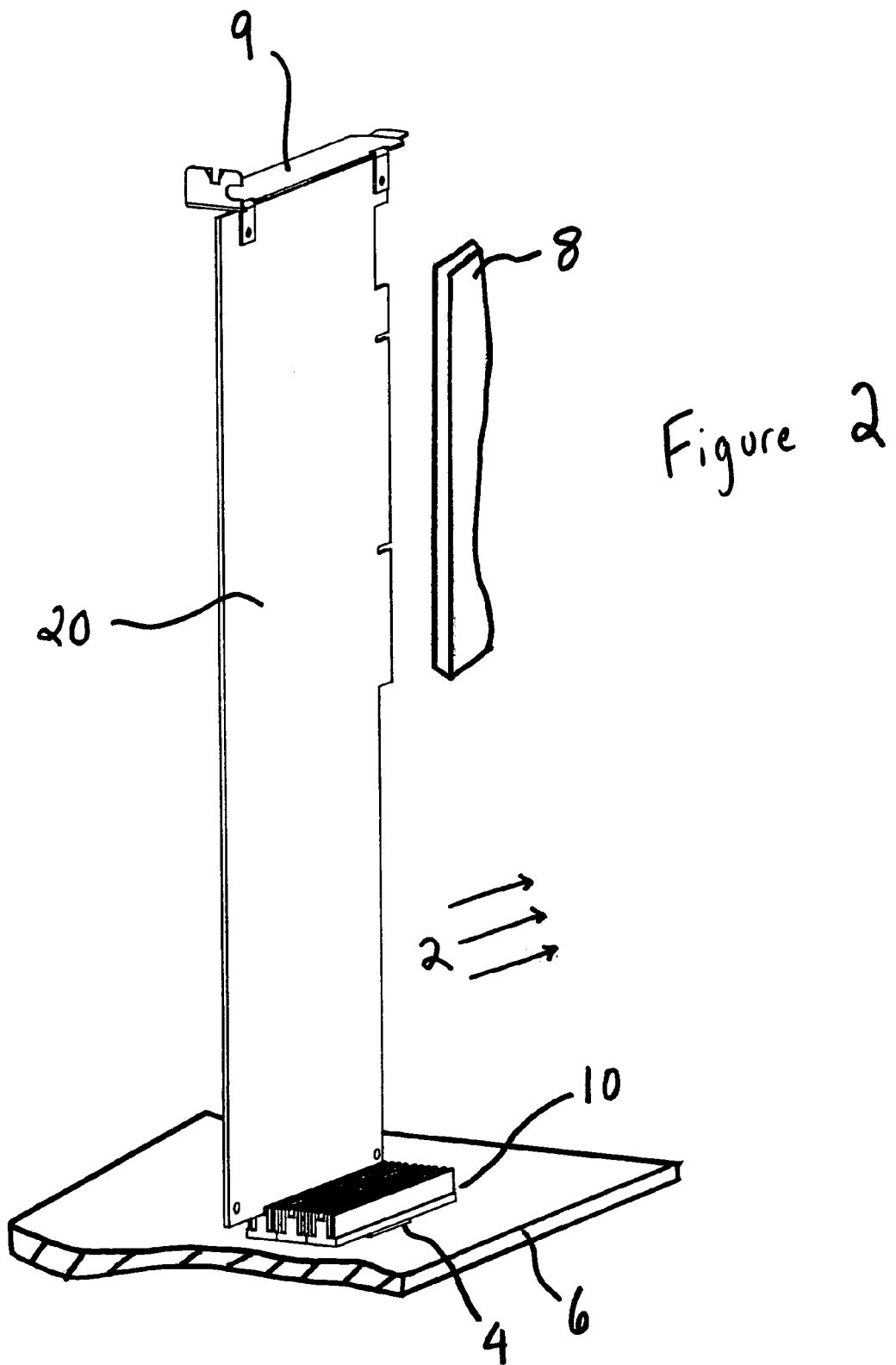
FIG. 2 is an isometric view, partially in section, of an exemplary electronic system having a heat sink with recesses for guiding a circuit card according to aspects of the present invention.

In the exemplary embodiment of the present invention shown in FIG. 2, heat generating component 4 is mounted on a circuit board 6 in an electronic assembly. Heat sink 10 is mounted in abutting contact with heat generating component 4, and may be affixed to circuit board 6 for structural stability. A connector 8 is provided in the electronic assembly to mate with circuit card 20. Optionally, airflow 2 may be generated to facilitate heat dissipation from heat sink 10.

Circuit card 20 may be hot exchangeable, meaning that it can be mated and de-mated with connector 8 while the electronic assembly is operating. Due to high packaging density, an exemplary electronic assembly may not provide adequate space to guide circuit card 20 into connector 8 by hand. Circuit card 20, for example, may be one of a plurality of circuit cards mounted parallel to one another and closely spaced to one another in an electronic system. Also, when hot exchange of circuit card 20 is performed, it is necessary to maintain clearance between circuit card 20 and adjacent electronics.

Accordingly, heat sink 10 is used to guide circuit card 20 into place by positioning a leading corner or edge portion of circuit card 20 in a corresponding one of the one or more recesses 16, while circuit card 20 extends away from heat sink 10, where it is more accessible for handling and manipulation. Then, circuit card 20 is advanced into its operating position by sliding an edge of circuit card 20 along a corresponding one of the one or more recesses 16. While circuit card 20 is advanced, the corresponding one of recesses 16 guide and support circuit card 20, facilitating mating circuit card 20 with connector 8. After circuit card 20 is mated to connector 8, the corresponding one of the one or more recesses 16 continues to support circuit card 20.

As shown in FIG. 2, mounting hardware 9 may be provided on circuit card 20 opposite heat sink 10 to secure circuit card 20 to the chassis or frame (not shown). Optionally, circuit card 20 is oriented generally parallel to airflow 2 to optimize heat dissipation both from heat sink 10 and from components (not shown) mounted on circuit card 20.

In an alternative exemplary embodiment of the present invention, heat sink 20 dissipates heat from a heat-generating component (not shown) mounted on circuit card 20 guided by heat sink 10. A thermal path from such component to heat sink 10 may be provided, for example, by a conductive spring or the like affixed in an abutting relationship with one of the mounted heat generating component and heat sink 10 and in sliding association with the other of the mounted heat generating component and heat sink 10. Alternatively, a conductive path is provided from the component, through or along the circuit card 20, and to the surface of the heat sink 10 defining the recess 16.

Figure 3:
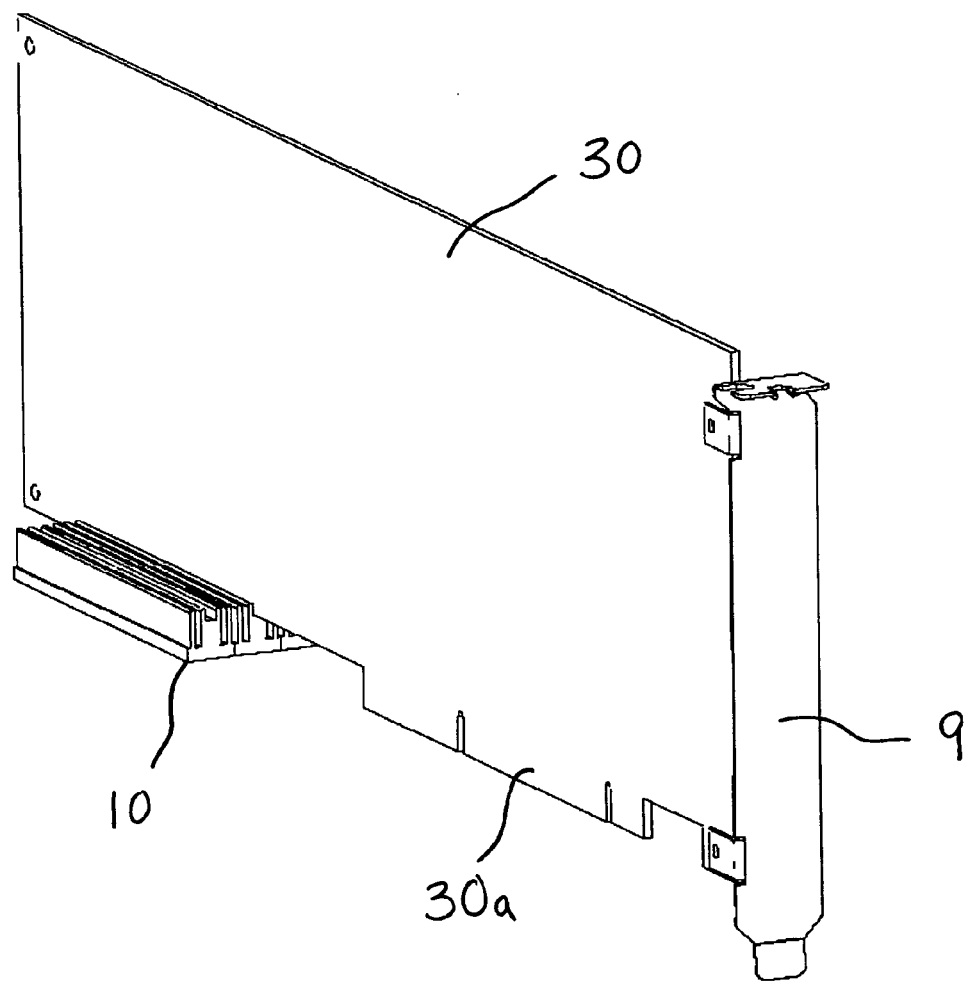
FIG. 3 is an isometric view of a circuit card and a heat sink in accordance with an exemplary embodiment of the present invention.

Although FIGS. 1-2 have primarily been described with respect to circuit boards including an edge portion that is slidingly engaged within a recess defined by the base and/or fins of a heat sink, the present invention is not limited thereto. FIG. 3 illustrates a circuit board 30 (e.g., a PCI card) having an edge portion engaged with a recess defined by heat sink 10. For example, the edge portion of circuit board 30 is engaged with the recess from above the heat sink, and not by being slid along the recess. Such a configuration may be particularly useful if the computer system defines an opening making a recess defined by heat sink 10 more accessible from above, and not from a slidingly engagable position.

Additionally, circuit board 30 includes mating portion 30a. Mating portion 30a is configured for engagement with a connector of the computer system (not shown). For example, mating portion 30a may include contacts (e.g., socket connector fingers not shown in FIG. 3) configured for engagement with corresponding connection points in the connector of the computer system. Because the edge portion of circuit board 30 that engages with a recess defined by heat sink 10 is along the same edge of circuit board 30 as mating portion 30a, it may be difficult (or even non-feasible) to slidingly engage the edge of circuit board 30 within the recess. As such, the edge portion of circuit board 30 is desirably engaged with the recess defined by heat sink 10 from above (and not by sliding engagement).

Further still, the computer system or electronic apparatus housing circuit board 30 may be configured such that while the edge portion engages with the recess defined by heat sink 10, mating portion 30a simultaneously engages with a respective connector(s). Such a configuration would help to ensure proper alignment of circuit board 30, because both the edge portion (engaging with a recess defined by heat sink 10) and mating portion 30a (engaging with a connector) have previously defined and distinct points of engagement within the computer system or electronic apparatus.

Figure 4:
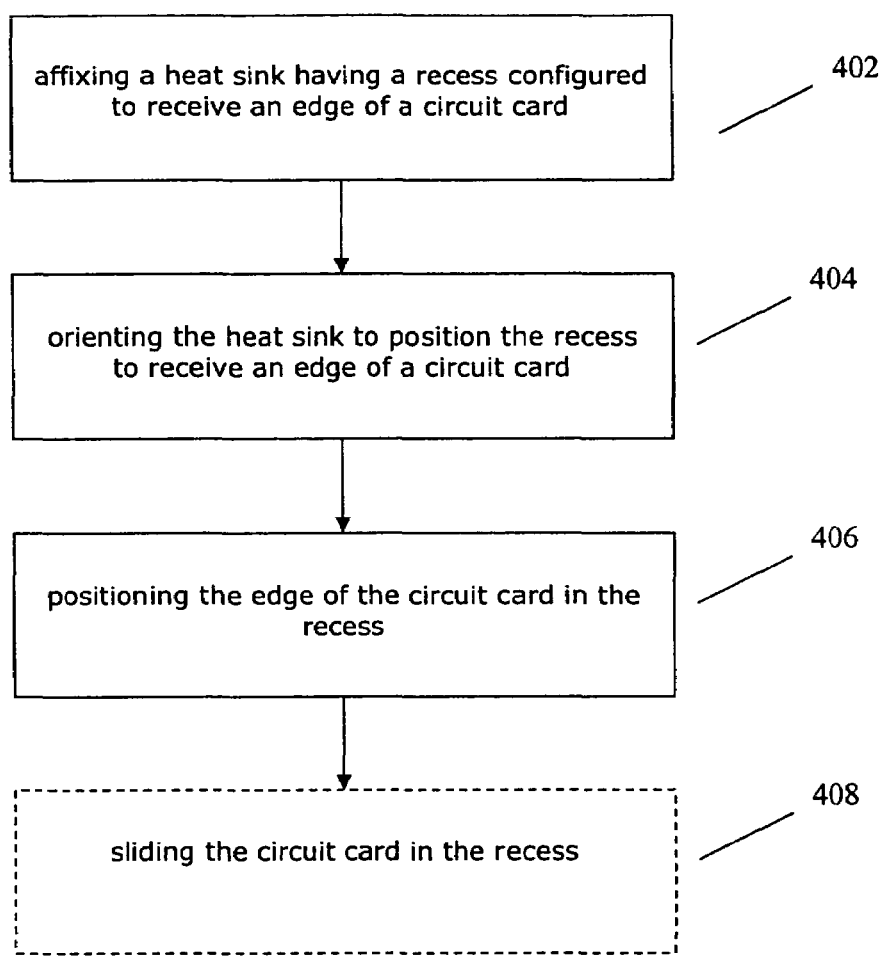
FIG. 4 is a flow diagram illustrating a method of supporting a circuit card in a computer system in accordance with an exemplary embodiment of the present invention.

FIG. 4 illustrates a method of supporting a circuit card within a computer system or electronic apparatus. At step 402, a heat sink is affixed in a computer system or other electronic apparatus. The heat sink defines a recess configured to receive an edge of a circuit card. At step 402, the heat sink is oriented such that the recess is positioned to receive an edge of a circuit card. At step 404, the edge of the circuit card is positioned, at least partially, in the recess defined by the heat sink. At optional step 406, the edge of the circuit card is slid in the recess defined by the heat sink.

Although the invention is illustrated and described herein with reference to specific embodiments, the invention is not intended to be limited to the details shown. Rather, various modifications may be made in the details within the scope and range of equivalents of the claims and without departing from the invention. For example, while the heat sink may comprise aluminum, other materials with good thermal conductivity may be used. This material may be electrically insulating and thermally conductive in applications where an electrically conductive path is undesirable.

Additionally, while the recesses defined by the base and/or fins of the heat sink have been illustrated and described as being primarily parallel with respect to one another, they are not limited thereto. For example, the recesses (and the fins of the heat sink) may be oriented perpendicularly with respect to one another, or may be oriented at any of a number of angles with respect to one another. Further, the recesses (and the fins of the heat sink) may be oriented in a radial configuration.

Further still, the heat sink described herein has wide application in computer systems and other electronic apparatuses. The heat sink may provide support and/or act as a guide for any of a number of computer cards, circuit boards, or other computer components, thereby reducing the space required for the computer system and concurrently providing the desired heat dissipation.

Also, while the slots in a heat sink may be configured to receive a circuit card in a sliding relationship to guide the circuit card into place, the slots may alternatively be keyed to receive an edge of the circuit card in a specific position.

A recess may be defined in the end of a fin, the side of a fin, between fins, or in the base. One recess may be provided in a heat sink, or multiple recesses may be provided either for receiving multiple circuit cards or for offering multiple positions for a circuit card. The recesses may be rectangular in shape or rounded at the bottom or otherwise shaped. Additionally, recesses may be continuous over the length of the heat sink or non-continuous structures at one or more locations along the length of the heat sink.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A heat sink configured to support an edge of a circuit card, said heat sink comprising: a thermally conductive base; a plurality of thermally conductive heat dissipating fins extending perpendicularly from said base, each fin having a length extending parallel to the base; two or more card supporting recesses, each card supporting recess at least partially defined by adjacent parallel faces of two adjacent fins extending perpendicularly from said base, the card supporting recesses defined in part by surfaces parallel to the base extending along the length of the fins, the card supporting recesses having a depth smaller than the height of said fins, and the adjacent parallel faces and the surface parallel to the base of each card supporting recess support the edge of a circuit card; at most three base recesses between adjacent card supporting recesses, each base recess at least partially defined by adjacent parallel faces of two adjacent fins extending perpendicularly from said base, the base recesses having a depth at least substantially equal to the height of said fins: and a face of the base disposed opposite said fins, said base being configured to be mounted with said face abutting a heat-generating component.

2. The heat sink of claim 1 wherein said base and said fins are formed by extrusion.

3. The heat sink of claim 1, wherein said two or more card supporting recesses are further configured to support the edge of the circuit card in sliding association with said heat sink.

4. The heat sink of claim 3 wherein said card supporting recesses is a slot configured to guide the edge of the circuit card during sliding movement of the circuit card.

5. The heat sink of claim 1 wherein each of said two or more of said card supporting recesses are further defined by said base.

6. The heat sink of claim 1 wherein said fins are oriented substantially parallel to one another.

7. A method for supporting a circuit card in a computer system, said method comprising the steps of: affixing in a computer system a heat sink having two or more card supporting recesses and at most three base recesses between adjacent card supporting recesses, each card supporting recess configured to receive an edge of a circuit card such that the card supporting recess orients the circuit card to enable mating the circuit card with a connector, the card supporting recess at least partially defined by at least one of a plurality of thermally conductive heat dissipating fins, and a surface extending parallel to a base of the heat sink, the card supporting recess having a depth smaller than the height of said fins, each base recess at least partially defined by adjacent parallel faces of two adjacent conductive heat dissipating fins extending perpendicularly from said base, the base recesses having a depth at least substantially equal to the height of said fins; abutting a face of the base disposed opposite the fins against a heat-generating component; and positioning the edge of the circuit card in one of the card supporting recesses by advancing the card in the one card supporting recess in a direction parallel to the base such that the edge of the circuit card is supported by the plurality of thermally conductive heat dissipating fins and the surface extending parallel to the base that at least partially define the one of the card supporting recesses.

8. The method of claim 7, wherein said positioning step comprises sliding the circuit card in the one of the card supporting recesses.

9. The method of claim 7, wherein said abutting step comprises affixing the heat sink to the heat-generating component.

10. The method of claim 9 wherein the heat-generating component is mounted on a circuit board, and said affixing step comprises affixing the heat sink with the one of the card supporting recesses disposed opposite the heat-generating component.

11. The method of claim 7, wherein the circuit card carries at least one heat generating component, and said positioning step comprises thermally coupling the at least one heat generating component of the circuit card to the heat sink when the circuit card is positioned in the one of the card supporting recesses.

12. The method of claim 7, wherein said abutting step is performed before the affixing step.

13. A circuit board assembly comprising: a circuit board; a heat generating component mounted on said circuit board; and a heat sink thermally coupled to said heat generating component, the heat sink having a base abutting the heat generating component and a plurality of fins disposed on a surface of the base opposite the heat-generating component for dissipating heat, the plurality of fins having faces parallel to one another, said parallel faces of the fins defining two or more card supporting recesses and at most three base recesses between adjacent card supporting recesses, each of said card supporting recesses extending parallel to the base and at least partially defined by at least one of said fins and by a surfaces parallel to the base extending along a length of the fins, the card supporting recess having a depth smaller than the height of said fins, and the parallel faces of the fins and the surface parallel to the base supporting and guiding an edge of a circuit card, each of said base recesses at least partially defined by adjacent parallel faces of two of said fins extending perpendicularly from said base the base recesses having a depth at least substantially equal to the height of said fins.

14. The circuit board assembly of claim 13 wherein said circuit card comprises an edge portion in sliding association with said card supporting recess.

15. The circuit board assembly of claim 13 further comprising a connector configured for electrically coupling said circuit card to a computer system, said card supporting recess of said heat sink being oriented to guide said circuit card for coupling said connector to said computer system.

16. A heat sink guiding one or more circuit cards and transferring heat, said heat sink comprising: a first surface defining two or more card supporting slots configured to guide an edge of a circuit card and at most three base slots between adjacent card supporting slots; a second surface opposite the first surface, the second surface being configured to abut a heat-generating component; and heat dissipating fins thermally coupled to said first surface, said two or more card supporting slots and said base slots at least partially defined by two adjacent parallel faces of said fins, said two or more card supporting slots and said base slots being defined in part by a portion of said first surface extending parallel to the base, said card supporting slots having a depth smaller than the height of said fins and said base slots having a depth substantially equal to the height of said fins, and the two adjacent parallel faces of said fins and the potion of said first surface extending parallel to the base of at least one card supporting slot supporting the edge of the circuit card, said heat sink being configured to provide a thermal path from the heat-generating component to said fins via said second surface.

17. The heat sink of claim 16 wherein the heat sink has a substantially constant cross-sectional shape.

18. A method for guiding a circuit board in a computer system, said method comprising: sliding an edge portion of the circuit board along an insertion axis in one of two or more card supporting recesses separated by at most three base recesses, the card supporting recesses defined by adjacent fins of a heat sink of the computer system such that the edge portion of the circuit board is supported by the adjacent fins and a surface extending parallel to a base of the heat sink defining the one of the two or more card supporting recesses, the insertion axis extending parallel to the base, the card supporting recesses having a depth smaller than the height of the fins of the heat sink and the base recesses having a depth at least substantially equal to the height of the fins of the heat sink; abutting a surface of the heat sink disposed opposite the fins against a heat generating component; and mating the circuit card with a connector.

19. The method of claim 18, wherein said abutting step is performed before the sliding step.

* * * * *